(12) United States Patent
Lee et al.

(10) Patent No.: US 11,625,115 B2
(45) Date of Patent: *Apr. 11, 2023

(54) TOUCH DISPLAY DEVICE

(71) Applicant: LG Display Co., Ltd., Seoul (KR)

(72) Inventors: Neung-Hee Lee, Paju-si (KR); Min-Su Kim, Daegu (KR); Sung-Wook Chang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/693,305

(22) Filed: Mar. 11, 2022

(65) Prior Publication Data

US 2022/0197424 A1 Jun. 23, 2022

Related U.S. Application Data

(63) Continuation of application No. 16/995,235, filed on Aug. 17, 2020, now Pat. No. 11,294,489.

(30) Foreign Application Priority Data

Nov. 28, 2019 (KR) .......................... 10-2019-0155536

(51) Int. Cl.
| | | |
|---|---|---|
| *G06F 3/041* | (2006.01) | |
| *H01L 27/32* | (2006.01) | |
| *H01L 51/52* | (2006.01) | |
| *G06F 3/044* | (2006.01) | |

(52) U.S. Cl.
CPC ............ *G06F 3/0412* (2013.01); *G06F 3/044* (2013.01); *H01L 27/3246* (2013.01); *H01L 27/3276* (2013.01); *H01L 51/5253* (2013.01)

(58) Field of Classification Search
CPC ... G06F 3/0412; G06F 3/044; H01L 27/3246; H01L 27/3276; H01L 51/5253
See application file for complete search history.

(56) References Cited

U.S. PATENT DOCUMENTS

| 10,978,520 B2 * | 4/2021 | Guo ...................... G06F 3/0443 |
| 2018/0097200 A1 * | 4/2018 | Park .................... H01L 27/3246 |
| 2020/0411596 A1 | 12/2020 | Guo et al. |
| 2022/0149321 A1 * | 5/2022 | Jeon .................... H01L 27/3246 |
| 2022/0149323 A1 * | 5/2022 | Kim ........................ H01L 51/56 |
| 2022/0216283 A1 * | 7/2022 | Kim .................... H01L 27/3265 |
| 2022/0246701 A1 * | 8/2022 | Lee .................... H01L 27/3248 |
| 2022/0320199 A1 * | 10/2022 | Lee .................... H01L 51/5218 |

FOREIGN PATENT DOCUMENTS

| KR | 10-2019-0084012 A | 7/2019 |
| KR | 10-2008504 B1 | 8/2019 |

* cited by examiner

*Primary Examiner* — Peter D McLoone
(74) *Attorney, Agent, or Firm* — Morgan, Lewis & Bockius LLP (57) ABSTRACT

A touch display device for preventing the occurrence of a short circuit between routing lines is disclosed. The touch display device includes a dam forming a boundary with an encapsulation unit covering a light-emitting element, and the dam is formed such that the height thereof in a region that overlaps routing lines, which are connected to touch electrodes disposed on the encapsulation unit, and the height thereof in a region that does not overlap the routing lines are different from each other, thereby preventing the occurrence of a short circuit between the routing lines.

12 Claims, 10 Drawing Sheets

TOUCH DISPLAY DEVICE

This application is a Continuation of co-pending U.S. patent application Ser. No. 16/995,235, filed on Aug. 17, 2020, which claims the benefit of Korean Patent Application No. 10-2019-0155536, filed on Nov. 28, 2019. Each of the above U.S. and Korean patent applications is hereby incorporated by reference in its entirety as if fully set forth herein.

BACKGROUND

Technical Field

The present disclosure relates to a touch display device, and more particularly to a touch display device for preventing the occurrence of a short circuit between routing lines.

Discussion of the Related Art

A touch screen is an input device through which a user may input a command by selecting instructions displayed on a screen of a display device using a hand or an object. That is, a touch screen converts a contact position that directly contacts a human hand or an object into an electrical signal and receives selected instructions based on the contact position as an input signal. Such a touch screen may substitute for a separate input device that is connected to a display device and operated, such as a keyboard or a mouse, and thus the range of application of the touch screen is continually increasing.

Recently, research and development have been actively conducted on a touch-screen-integrated display device, in which a touch screen is disposed on a display panel, such as a liquid crystal display panel or an organic electroluminescent display panel. However, a short circuit may occur between neighboring routing lines during the process of manufacturing routing lines for driving a touch screen.

SUMMARY

Accordingly, embodiments of the present disclosure are directed to a touch display device that substantially obviates one or more problems due to limitations and disadvantages of the related art.

An object of the present disclosure is to provide a touch display device for preventing the occurrence of a short circuit between routing lines.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a touch display device comprises a dam forming a boundary with an encapsulation unit covering a light-emitting element, and the dam is formed such that the height thereof in a region that overlaps routing lines, which are connected to touch electrodes disposed on the encapsulation unit, and the height thereof in a region that does not overlap the routing lines are different from each other, thereby preventing the occurrence of a short circuit between the routing lines.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Reference will now be made in detail to exemplary embodiments of the present invention, examples of which are illustrated in the accompanying drawings.

Figure 1:
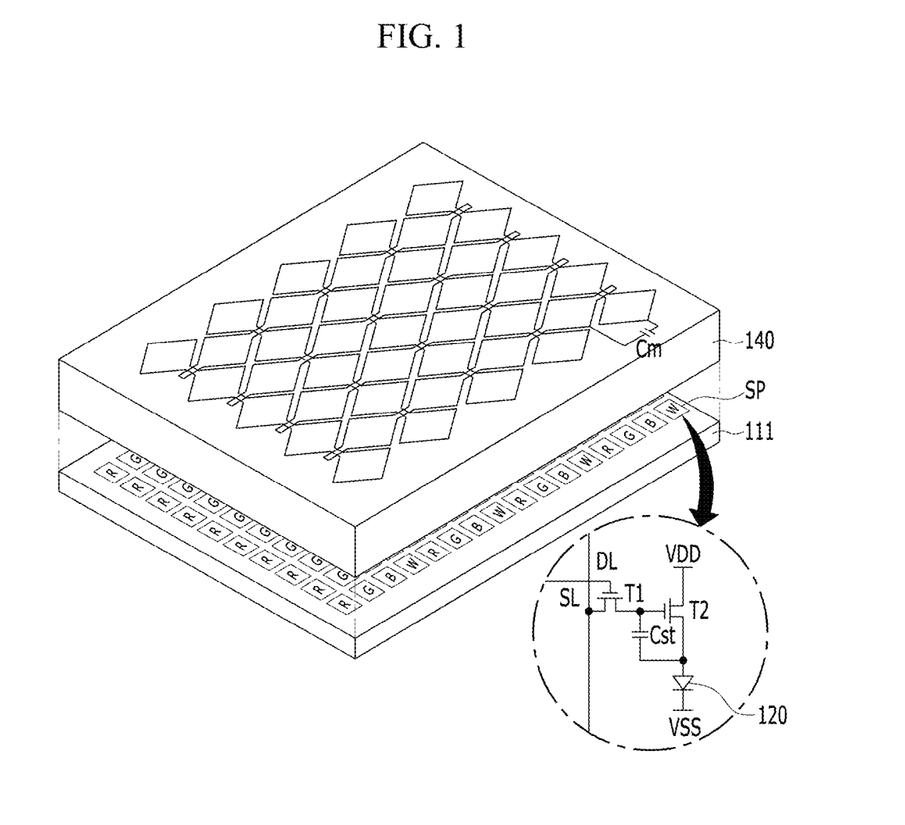
FIG. 1 is a perspective view showing a touch display device according to the present invention.

FIG. 1 is a perspective view of a touch display device according to the present invention.

Figure 2:
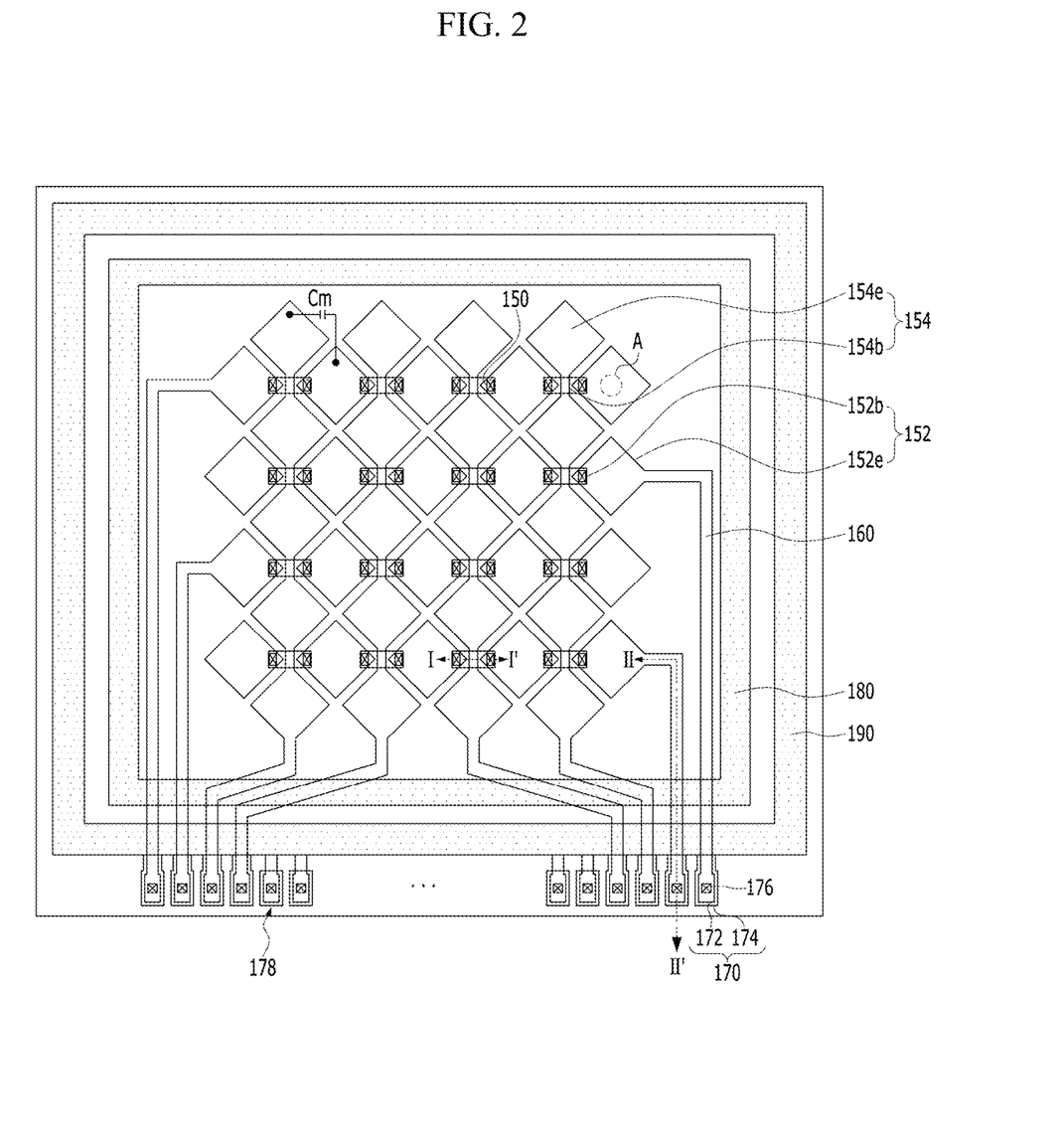
FIG. 2 is a plan view showing the touch display device shown in FIG. 1.

A touch display device shown in FIG. 1 senses the presence or absence of a touch and a touch position by sensing a variation in mutual capacitance Cm (a touch sensor) or self-capacitance in response to a user touch through touch electrodes 152e and 154e shown in FIG. 2 for a touch period. The touch display device shown in FIG. 1 displays an image through a unit pixel including a light-emitting element 120. The unit pixel, as shown in FIG. 1, is composed of red (R), green (G) and blue (B) subpixels SP, which are arranged in a row, is composed of red (R), green (G), blue (B) and white (W) subpixels SP, which are arranged in a row, or is formed in a Pentile structure. The touch display device includes a plurality of subpixels SP arranged in a matrix form on a substrate 111, an encapsulation unit 140 disposed on the plurality of subpixels SP, and a touch sensor Cm disposed on the encapsulation unit 140.

The substrate 111 is formed of a plastic material or a glass material, which is flexible so as to be foldable or bendable. For example, the substrate 111 is formed of polyimide (PI), polyethylene terephthalate (PET), polyethylene naphthalate (PEN), polycarbonate (PC), polyethersulfone (PES), polyacrylate (PAR), polysulfone (PSF), or cyclic-olefin copolymer (COC).

Figure 3:
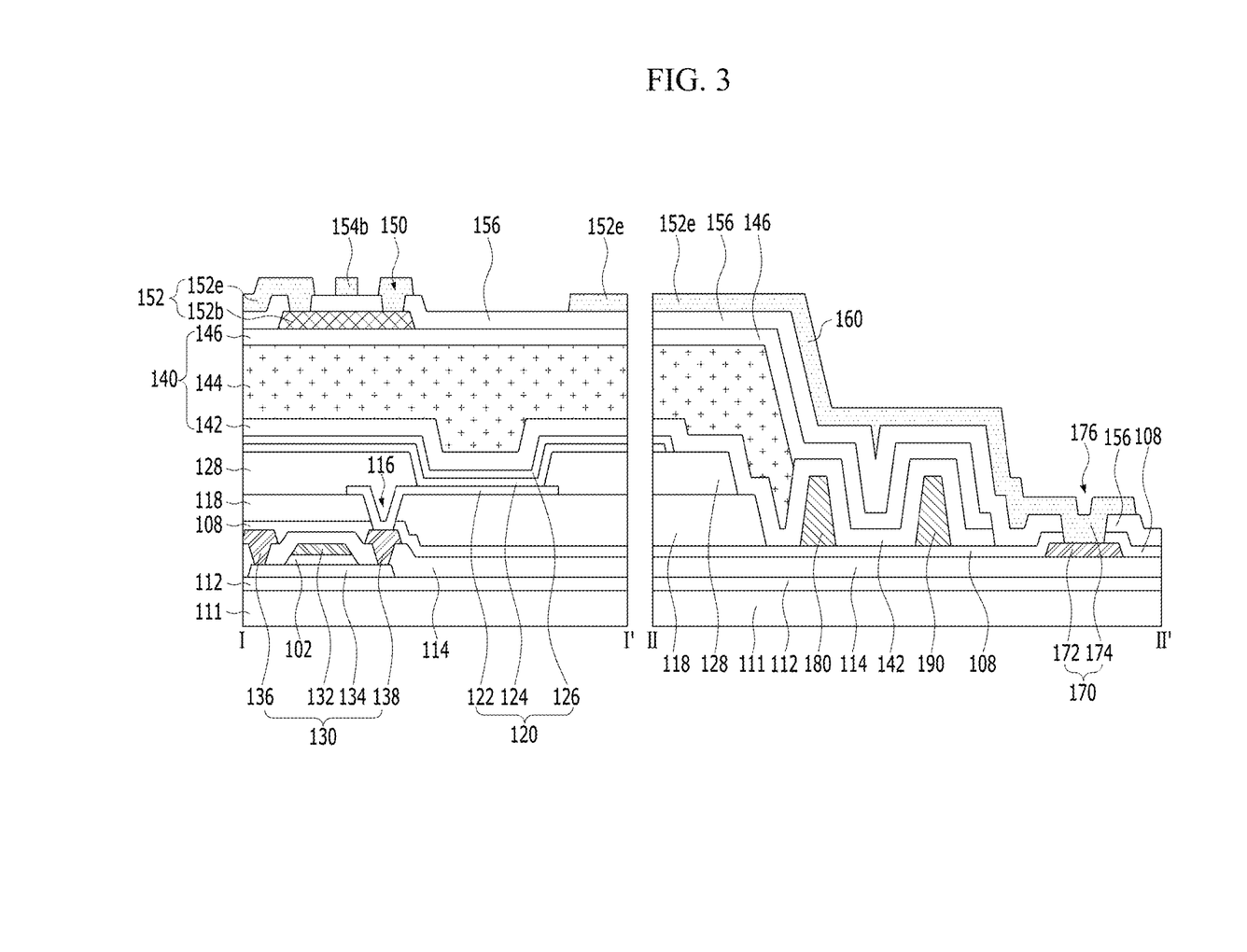
FIG. 3 is a cross-sectional view of the touch display device taken along lines I-I' and II-II' in FIG. 2.

The touch sensor Cm, as shown in FIGS. 2 and 3, includes a touch insulating film 156 disposed on the encapsulation unit 140, and further includes a touch-sensing line 154 and a touch-driving line 152 disposed so as to intersect each other, with the touch insulating film 156 interposed therebetween. The touch sensor Cm charges an electric charge using a touch-driving pulse supplied to the touch-driving line 152, and discharges the electric charge to the touch-sensing line 154.

The touch-driving line 152 includes a plurality of first touch electrodes 152e and first bridges 152b electrically connecting the first touch electrodes 152e to each other.

The first touch electrodes 152e are spaced apart from each other at regular intervals in an X direction, which is a first direction, on the touch insulating film 156. Each of the first touch electrodes 152e is electrically connected to a neighboring first touch electrode 152e via the first bridge 152b.

The first bridge 152b is formed on a second inorganic encapsulation layer 146 or a touch buffer film (not shown) disposed on the second inorganic encapsulation layer. The first bridge 152b is exposed through a touch contact hole 150 that penetrates the touch insulating film 156, and is electrically connected to the first touch electrode 152e.

The touch-sensing line 154 includes a plurality of second touch electrodes 154e and second bridges 154b electrically connecting the second touch electrodes 154e to each other.

The second touch electrodes 154e are spaced apart from each other at regular intervals in a Y direction, which is a second direction, on the touch insulating film 156. Each of the second touch electrodes 154e is electrically connected to a neighboring second touch electrode 154e via the second bridge 154b.

The second bridge 154b is disposed on the touch insulating film 156, which is coplanar with the second touch electrode 154e, and thus is electrically connected to the second touch electrode 154e without a separate contact hole.

According to the present invention, each of the touch-driving line 152 and the touch-sensing line 154 is connected to a touch-driving unit (not shown) via the routing line 160 and the touch pad 170.

The touch pad 170 is connected to a signal transmission film (not shown), on which the touch-driving unit is mounted. The touch pad 170 is composed of first and second touch pad electrodes 172 and 174.

The first touch pad electrode 172 is disposed on at least one of the substrate 111, a buffer layer 112, and an interlayer insulating film 114, which is disposed below the encapsulation unit 140. The first touch pad electrode 172 is formed of the same material as at least one of a gate electrode 132, a source electrode 136, and a drain electrode 138 of a driving transistor T2 130 in the same plane, and has a single-layered or multi-layered structure. For example, since the first touch pad electrode 172 is formed of the same material as the source and drain electrodes 136 and 138 and is disposed on the interlayer insulating film 114, the first pad electrode 172 is formed through the same mask process as the source and drain electrodes 136 and 138.

The second touch pad electrode 174 is electrically connected to the first touch pad electrode 172, which is exposed through a pad contact hole 176 that penetrates the protective film 108 and the touch insulating film 156.

Since the second touch pad electrode 174 is formed through the same mask process as the first and second touch electrodes 152e and 154e, the second touch pad electrode 174 is formed of the same material as the first and second touch electrodes 152e and 154e in the same plane. The second touch pad electrode 174 extends from the routing line 160, and thus is electrically connected to the routing line 160 without a separate contact hole.

In addition, the second touch pad electrode 174 is exposed to the outside, and is connected to a signal transmission film (not shown), on which the touch-driving unit is mounted, via an anisotropic conductive film.

A display pad 178 is also disposed in a non-active area (a bezel), in which the touch pad 170 is disposed. For example, as shown in FIG. 2, display pads 178 may be disposed between touch pads 170, or the touch pads 170 may be disposed between the display pads 178. Alternatively, the touch pad 170 may be disposed at one side of the display panel, and the display pad 178 may be disposed at the opposite side of the display panel. However, the arrangement of the touch pad 170 and the display pad 178 is not limited to the structure shown in FIG. 2, and may be variously changed depending on the design requirements of the display device.

The display pad 178 is formed in a stack structure different from that of the touch pad 170, or is formed in the same stack structure as the touch pad 170.

The routing line 160 transmits a touch-driving pulse generated in the touch-driving unit to the touch-driving line 152, and transmits a touch signal from the touch-sensing line 154 to the touch-driving unit through the touch pad 170. Accordingly, the routing line 160 is formed between each of the first and second touch electrodes 152e and 154e and the touch pad 170 to electrically connect each of the first and second touch electrodes 152e and 154e to the touch pad 170.

The routing line 160 is disposed along the side surface of the encapsulation unit 140 on the second inorganic encapsulation layer 146, the touch insulating film 156, or the touch buffer film (not shown). As shown in FIG. 2, the routing line 160 extends from the first touch electrode 152e to at least one of the left side and the right side of the active area AA, and is connected to the touch pad 170. In addition, the routing line 160 extends from the second touch electrode 154e to at least one of the upper side and the lower side of the active area, and is connected to the touch pad 170. This arrangement of the routing line 160 may be variously changed depending on the design requirements of the display device. The routing line 160 is disposed above at least one dam 180 or 190 so as to intersect the at least one dam 180 or 190.

A touch protective film (not shown) is formed so as to cover the routing line 160, the touch electrodes 152e and 154e, and the bridges 152b and 154b. The touch protective film (not shown) prevents the touch electrodes 152e and 154e and the bridges 152b and 154b from being damaged by external shocks or moisture.

According to the present invention, each of the first and second touch electrodes 152e and 154e is formed in a region corresponding to a plurality of subpixels SP in consideration of the size of an area touched by a user. For example, each of the touch electrodes 152e and 154e is formed in a region that is from several times to several hundred times larger than the size of one subpixel SP.

The first and second touch electrodes 152e and 154e and the first and second bridges 152b and 154b are formed in a single-layered or multi-layered structure using opaque metal having high corrosion resistance and acid resistance and excellent conductivity, such as Ta, Ti, Cu, or Mo, or are formed in a single-layered or multi-layered structure using a ITO, IZO, IGZO or ZnO-based transparent conductive film and opaque metal. For example, the first and second touch electrodes 152e and 154e and the first and second bridges 152b and 154b are formed of Ti/Al/Ti, which is low-resistance metal. Accordingly, the resistance and capacitance of each of the touch electrodes 152e and 154e and the bridges 152b and 154b are reduced. As a result, the RC time constant is reduced, thus improving touch sensitivity.

Figure 4:
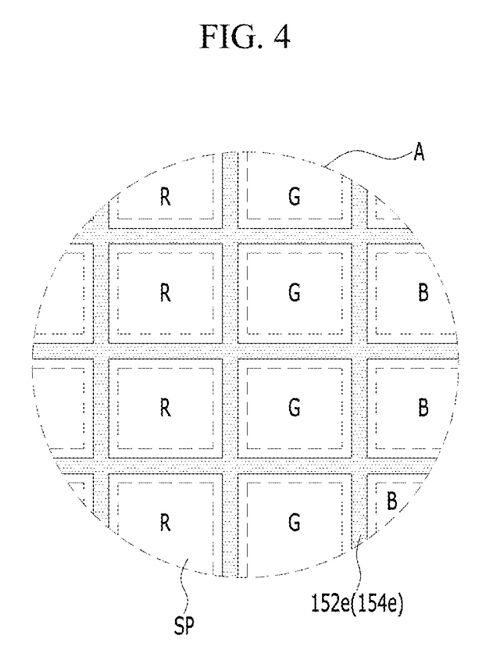
FIG. 4 is an enlarged plan view of region A in FIG. 2.

As shown in FIGS. 3 and 4, the first and second touch electrodes 152e and 154e and the first and second bridges 152b and 154b, which include opaque metal, are formed in a mesh type such that they do not overlap the emission areas of the red (R), green (G) and blue (B) subpixels SP and overlap a bank 128 disposed between the emission areas.

The first and second touch electrodes 152e and 154e and the first and second bridges 152b and 154b, which are formed in a mesh type, overlap the bank 128, and have a line width equal to or smaller than that of the bank 128. Accordingly, it is possible to prevent an aperture ratio and transmissivity from being deteriorated by the first and second touch electrodes 152e and 154e and the first and second bridges 152b and 154b.

Each of the subpixels SP includes a pixel-driving circuit and a light-emitting element 120 connected to the pixel-driving circuit.

The pixel-driving circuit includes a switching transistor T1, a driving transistor T2, and a storage capacitor Cst. In the present invention, a structure in which the pixel-driving circuit includes two transistors T and one capacitor C is described by way of example, but the present invention is not limited thereto. That is, a pixel-driving circuit having a 3T1C structure or 3T2C structure in which three or more transistors T and one or more capacitors C are provided may be used.

The switching transistor T1 is turned on when a scan pulse is supplied to a scan line SL, and supplies a data signal supplied to a data line DL to the storage capacitor Cst and a gate electrode of the driving transistor T2.

The driving transistor T2 controls the current supplied from a high-voltage (VDD) supply line to the light-emitting element 120 in response to the data signal supplied to the gate electrode of the driving transistor T2, thereby adjusting the amount of light emitted from the light-emitting element 120. Even when the switching transistor T1 is turned off, the driving transistor T2 maintains the emission of light by the light-emitting element 120 by supplying a constant amount of current thereto using the voltage charged in the storage capacitor Cst until the data signal of the next frame is supplied.

The driving thin-film transistor T2 130, as shown in FIG. 3, includes a semiconductor layer 134 disposed on a buffer layer 112, a gate electrode 132 overlapping the semiconductor layer 134 with a gate insulating film 102 interposed therebetween, and source and drain electrodes 136 and 138 formed on an interlayer insulating film 114 so as to be in contact with the semiconductor layer 134. The semiconductor layer 134 is formed of at least one of an amorphous semiconductor material, a polycrystalline semiconductor material, and an oxide semiconductor material.

The light-emitting element 120 includes an anode 122, a light-emitting stack 124 formed on the anode 122, and a cathode 126 formed on the light-emitting stack 124.

The anode 122 is electrically connected to the drain electrode 138 of the driving thin-film transistor T2 130, which is exposed through a pixel contact hole that penetrates a pixel planarization layer 118.

At least one light-emitting stack 124 is formed on the anode 122 in an emission area that is defined by the bank 128. The at least one light-emitting stack 124 is formed by stacking a hole-related layer, an organic emission layer, and an electron-related layer on the anode 122 in that order or in the reverse order. In addition, the light-emitting stack 124 may include first and second light-emitting stacks, which face each other with a charge generation layer interposed therebetween. In this case, the organic emission layer of any one of the first and second light-emitting stacks generates blue light, and the organic emission layer of the other one of the first and second light-emitting stacks generates yellow-green light, whereby white light is generated through the first and second light-emitting stacks. Since the white light generated in the light-emitting stack 124 is incident on a color filter located above or below the light-emitting stack 124, a color image may be realized. Alternatively, colored light corresponding to each subpixel may be generated in each light-emitting stack 124 without a separate color filter in order to realize a color image. That is, the light-emitting stack 124 of the red (R) subpixel may generate red light, the light-emitting stack 124 of the green (G) subpixel may generate green light, and the light-emitting stack 124 of the blue (B) subpixel may generate blue light.

The cathode 126 is formed so as to face the anode 122, with the light-emitting stack 124 interposed therebetween.

The encapsulation unit 140 prevents external moisture or oxygen from entering the light-emitting element 120, which is vulnerable to external moisture or oxygen. To this end, the encapsulation unit 140 includes a plurality of inorganic encapsulation layers 142 and 146 and an organic encapsulation layer 144 disposed between the plurality of inorganic encapsulation layers 142 and 146. The inorganic encapsulation layer 146 is disposed at the top of the encapsulation unit 140. In this case, the encapsulation unit 140 includes at least two inorganic encapsulation layers 142 and 146 and at least one organic encapsulation layer 144. In the present invention, the structure of the encapsulation unit 140 in which the organic encapsulation layer 144 is disposed between the first and second inorganic encapsulation layers 142 and 146 will be described by way of example.

The first inorganic encapsulation layer 142 is formed on the substrate 111, on which the cathode 126 has been formed, at the position that is the closest to the light-emitting element 120. The first inorganic encapsulation layer 142 is formed of an inorganic insulating material that is capable of being deposited at a low temperature, such as silicon nitride ($SiN_x$), silicon oxide ($SiO_x$), silicon oxynitride (SiON), or aluminum oxide ($Al_2O_3$) Thus, since the first inorganic encapsulation layer 142 is deposited in a low-temperature atmosphere, it is possible to prevent damage to the light-emitting stack 124, which is vulnerable to a high-temperature atmosphere, during the process of depositing the first inorganic encapsulation layer 142.

The second inorganic encapsulation layer 146 is formed on the substrate 111, on which the organic encapsulation layer 144 has been formed, so as to cover the top and side surfaces of each of the organic encapsulation layer 144 and the first inorganic encapsulation layer 142. Accordingly, the second inorganic encapsulation layer 146 minimizes or prevents permeation of external moisture or oxygen into the first inorganic encapsulation layer 142 and the organic encapsulation layer 144. The second inorganic encapsulation layer 146 is formed of an inorganic insulating material, such as silicon nitride ($SiN_x$), silicon oxide ($SiO_x$), silicon oxynitride (SiON), or aluminum oxide ($Al_2O_3$).

The organic encapsulation layer 144 serves to dampen the stress between the respective layers due to bending of the organic light-emitting display device and to increase planarization performance. The organic encapsulation layer 144 is formed of an organic insulating material, such as acrylic resin, epoxy resin, polyimide, polyethylene, or silicon oxycarbide (SiOC).

Figure 5:
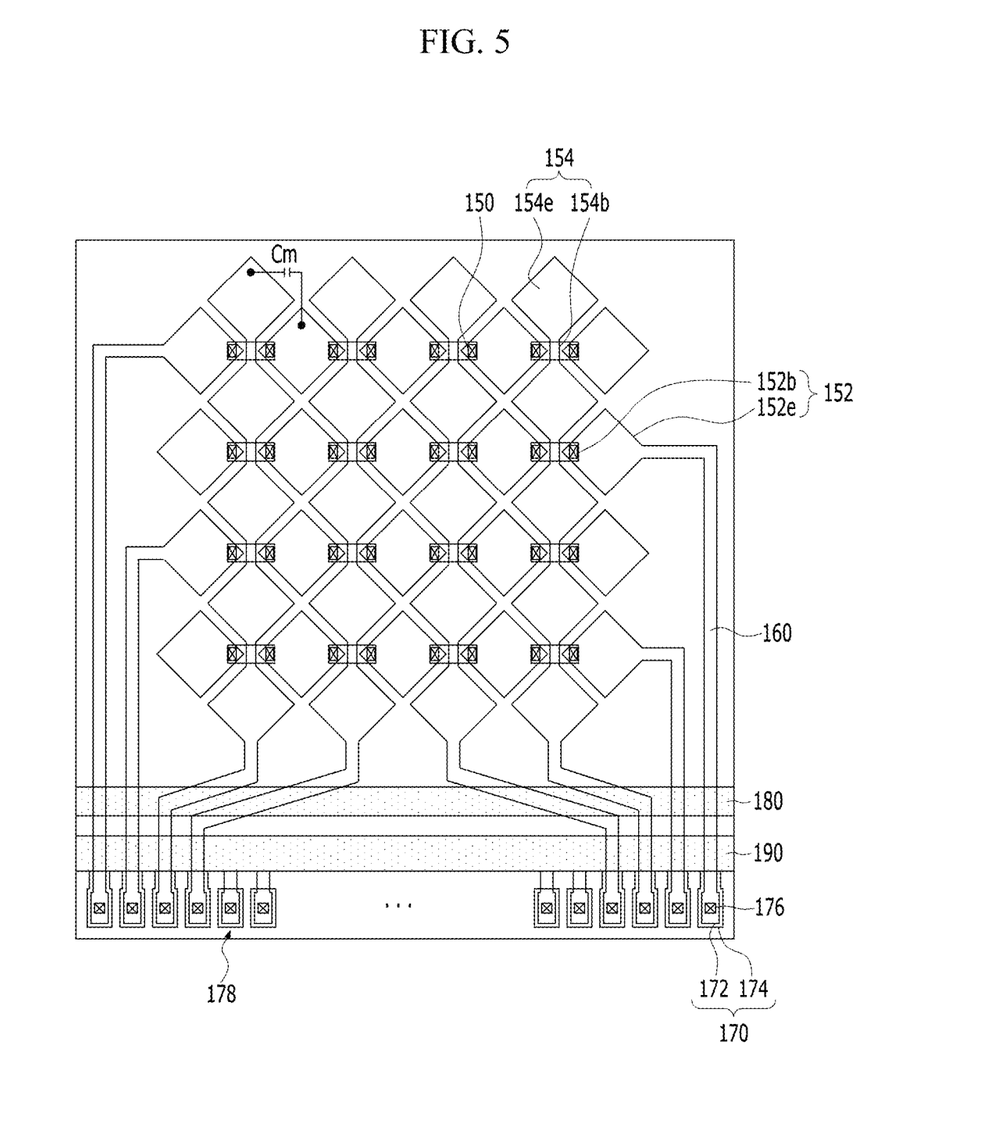
FIG. 5 is a plan view showing another embodiment of a dam shown in FIG. 2.

When the organic encapsulation layer 144 is formed through an inkjet method, at least one dam 180 or 190 is disposed in order to prevent the organic encapsulation layer 144, which is in a liquid state, from spreading to the edge of the substrate 111. The at least one dam 180 or 190 may prevent the organic encapsulation layer 144 from spreading to a pad area formed at the outermost portion of the substrate 111, in which the touch pad 170 and the display pad 178 are disposed. To this end, the at least one dam 180 or 190 may be formed so as to completely surround the active area in which the light-emitting element 120 is disposed, as shown in FIG. 2, or may be formed only between the active area and the pad area, as shown in FIG. 5. When the pad area in which the touch pad 170 and the display pad 178 are disposed is disposed at one side of the substrate 111, the at least one dam 180 or 190 is disposed only on the one side of the substrate 111. When the pad area in which the touch pad 170 and the display pad 178 are disposed is disposed at opposite sides of the substrate 111, the at least one dam 180 or 190 is disposed on the opposite sides of the substrate 111. In the present invention, a structure in which the at least one dam includes a first dam 180 and a second dam 190, which are spaced apart from each other, will be described by way of example.

Figure 6:
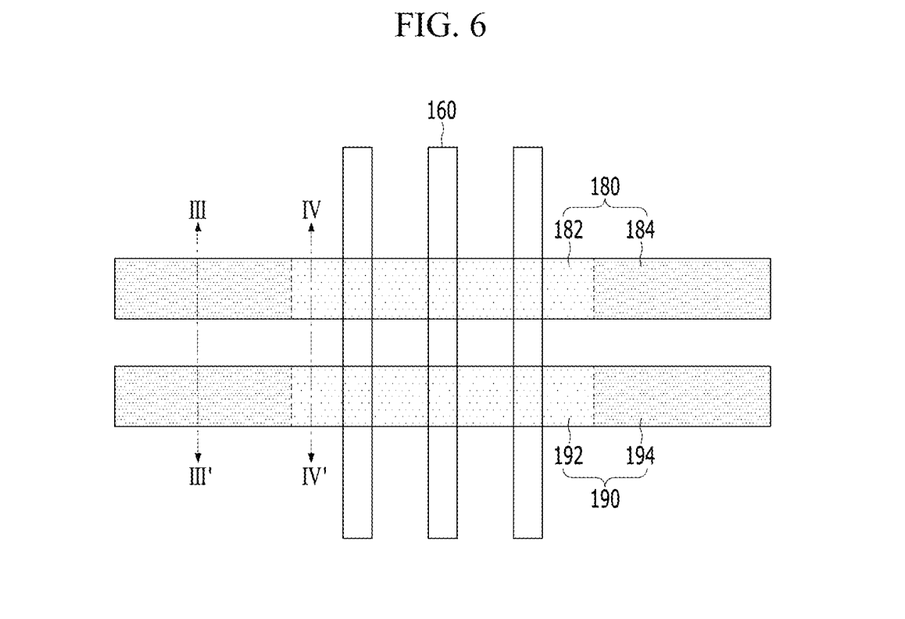
FIG. 6 is a plan view showing the dam shown in FIGS. 2 and 5 in detail.

The first dam 180 is disposed close to the active area, and includes a first low dam 182 and a first high dam 184, which have different heights from each other, as shown in FIG. 6. The height LH1 of the first low dam 182 is formed to be lower than the height LH2 of a second low dam 192, as shown in FIGS. 7A and 7B.

The second dam 190 is disposed farther from the active area than the first dam 180, and includes a second low dam 192 and a second high dam 194, which have different heights from each other. The height HH2 of the second high dam 194 is formed to be the same as or higher than the height HH1 of the first high dam 184, as shown in FIGS. 7A, 7B and FIG. 8.

The first and second high dams 184 and 194 are disposed in a region that does not overlap the routing line 160, and are formed to have heights higher than those of the first and second low dams 182 and 192. The first and second low dams 182 and 192 are disposed in a region that overlaps the routing line 160, and are formed to have heights lower than those of the first and second high dams 184 and 194.

Figure 7A:
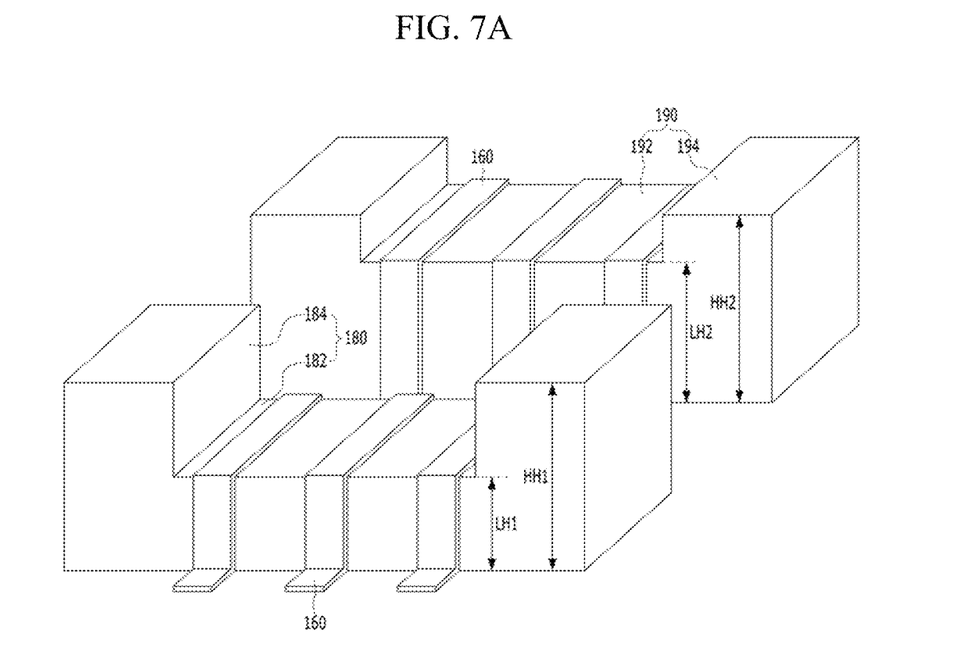
FIGS. 7A and 7B are perspective views showing first and second dams shown in FIG. 6.
Figure 7B:
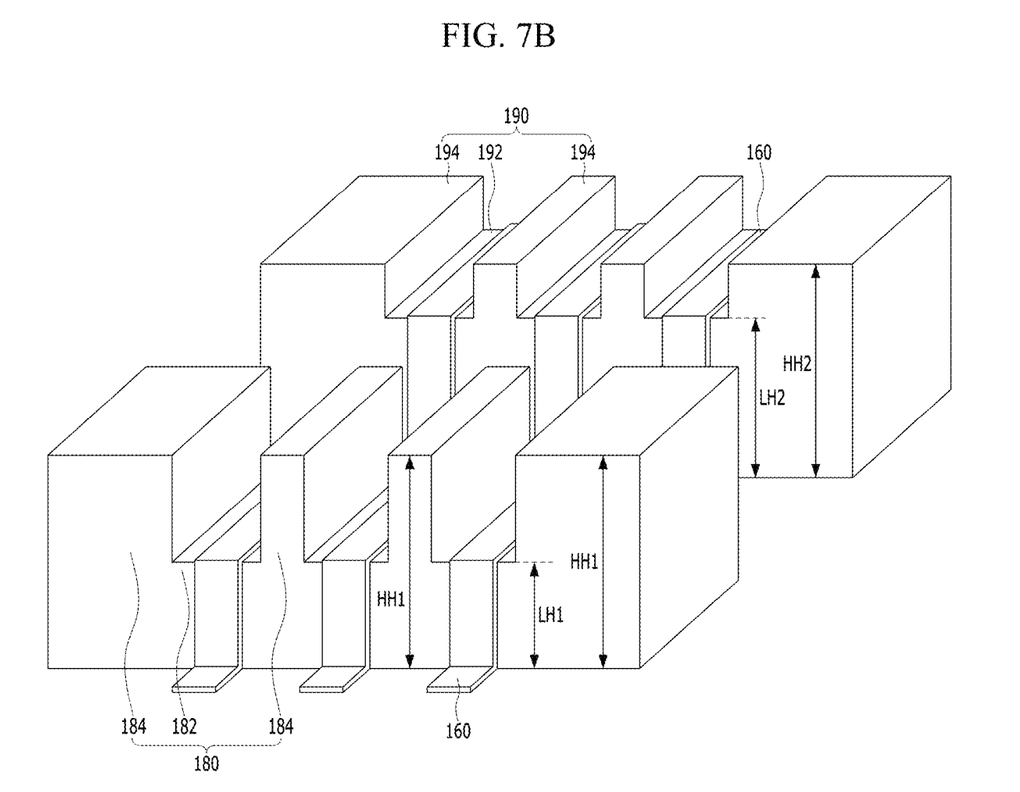

In this case, as shown in FIG. 7A, the first and second low dams 182 and 192 are disposed between the routing lines 160. Alternatively, as shown in FIG. 7B, the first and second high dams 184 and 194 are disposed between the routing lines 160.

Figure 8:
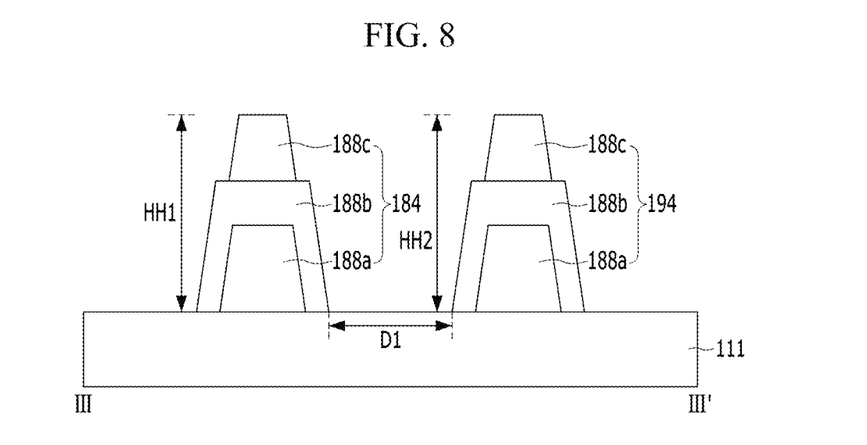
FIG. 8 is a cross-sectional view of the dam taken along line in FIG. 6.

As shown in FIG. 8, each of the first and second high dams 184 and 194 is formed in a three-layered structure in which first to third sub-dams 188a, 188b and 188c are sequentially stacked.

The first sub-dam 188a is formed of the same material as the pixel planarization layer 118 together therewith through the same mask process.

The second sub-dam 188b is formed of the same material as the bank 128 together therewith through the same mask process. The second sub-dam 188b is disposed on the side and top surfaces of the first sub-dam 188a so as to cover the side and top surfaces of the first sub-dam 188a. Since the bottom surface area of each of the dams 180 and 190 is increased by the second sub-dam 188b, the dams 180 and 190 are prevented from collapsing.

A spacer (not shown) is disposed on the bank 128 in order to support a fine metal mask (FMM) used to form the light-emitting stack 124. The third sub-dam 188c is formed of the same material as the spacer together therewith through the same mask process. The third sub-dam 188c is formed on the top surface of the second sub-dam 188b.

Figure 9A:
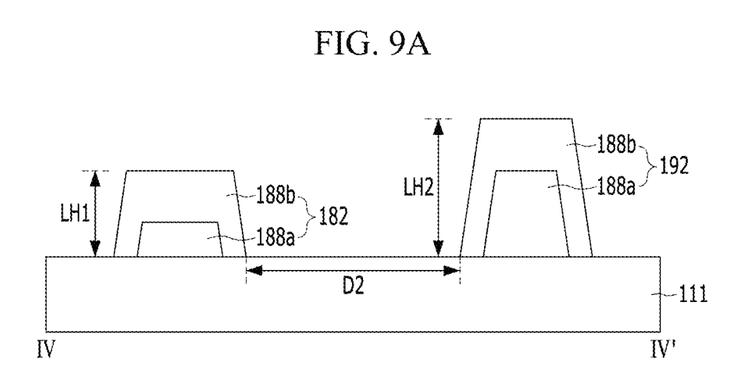
FIGS. 9A to 9C are cross-sectional views of the dam taken along line IV-IV' in FIG. 6.
Figure 9B:
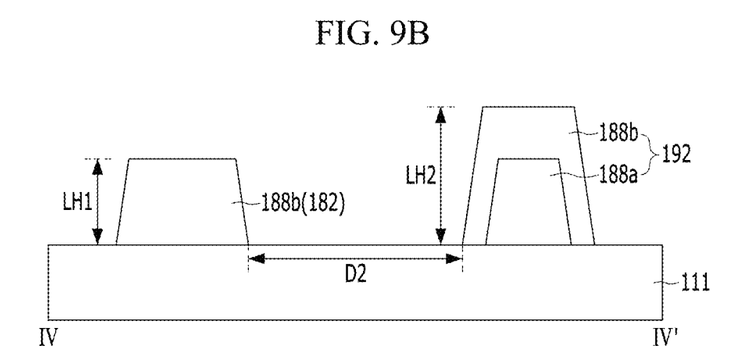
Figure 9C:
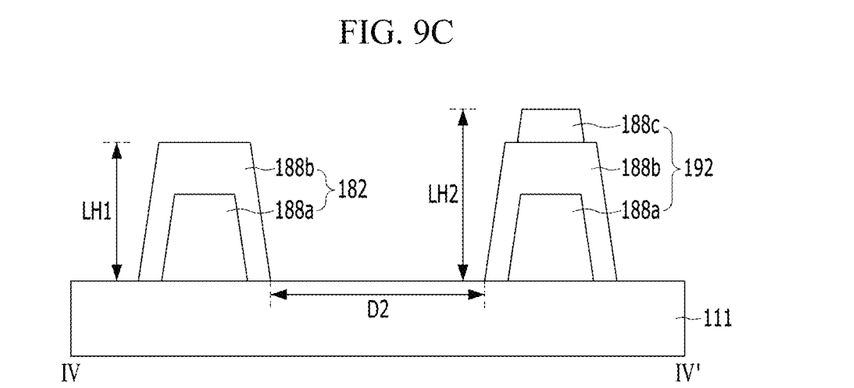

The first and second low dams 182 and 192 are formed to have heights lower than those of the first and second high dams 184 and 194. That is, as shown in FIGS. 9A to 9C, each of the first and second low dams 182 and 192 has a layer structure of two or less layers using a maximum of two of the first to third sub-dams 188a, 188b and 188c. In this case, the second low dam 192, which is disposed farther from the active area, is formed to be higher than the first low dam 182, which is disposed closer to the active area.

Each of the first and second low dams 182 and 192 shown in FIG. 9A is formed in a two-layered structure composed of two of the first to third sub-dams 188a, 188b and 188c. The height of any one of the two sub-dams included in the second low dam 192 is formed to be higher than the height of any one of the two sub-dams included in the first low dam 182. For example, each of the first and second low dams 182 and 192 is formed in a two-layered structure composed of the first and second sub-dams 188a and 188b. The second low dam 192 is formed in a two-layered structure in which the first sub-dam 188a, which is higher than the first sub-dam 188a of the first low dam 182 and is as high as the first sub-dam 188a of the first high dam 184, and the second sub-dam 188b are sequentially stacked.

The first low dam 182 shown in FIG. 9B is formed in a single-layered structure composed of any one of the first to third sub-dams 188a, 188b and 188c, and the second low dam 192 is formed in a two-layered structure composed of two of the first to third sub-dams 188a, 188b and 188c.

The first low dam 182 shown in FIG. 9C is formed in a two-layered structure composed of two of the first to third sub-dams 188a, 188b and 188c. The second low dam 192 is formed in a three-layered structure in which the first to third sub-dams 188a, 188b and 188c are sequentially stacked. The height of at least one of the first to third sub-dams 188a, 188b and 188c included in the second low dam 192 is formed to be lower than the height of at least one of the first to third sub-dams 188a, 188b and 188c included in the second high dam 194. For example, the first sub-dam 188a included in the second low dam 192 is formed to have a lower height than the first sub-dam included in the second high dam 194.

As such, since the first and second low dams 182 and 192, which overlap the routing lines 160, are formed to have lower heights than the first and second high dams 184 and 194, the valley between the first and second low dams 182 and 192 is formed to be shallower than the valley between the first and second high dams 184 and 194. Accordingly, when the routing line 160 is patterned so as to cross the first and second low dams 182 and 192, no residual film of the routing line 160 remains in the shallow valley between the first and second low dams 182 and 192, thereby preventing the occurrence of a short circuit between routing lines 160.

The spacing distance D2 between the first low dam 182 and the second low dam 192, which have lower heights, is formed to be longer than the spacing distance D1 between the first high dam 184 and the second high dam 194, which have higher heights. Accordingly, even when the organic encapsulation layer 144 spreads over the first low dam 182, the organic encapsulation layer 144 is prevented from spreading over the second low dam 192 by the increase in the movement path of the organic encapsulation layer 144 due to the increase in the spacing distance between the first low dam 182 and the second low dam 192.

Figure 10:
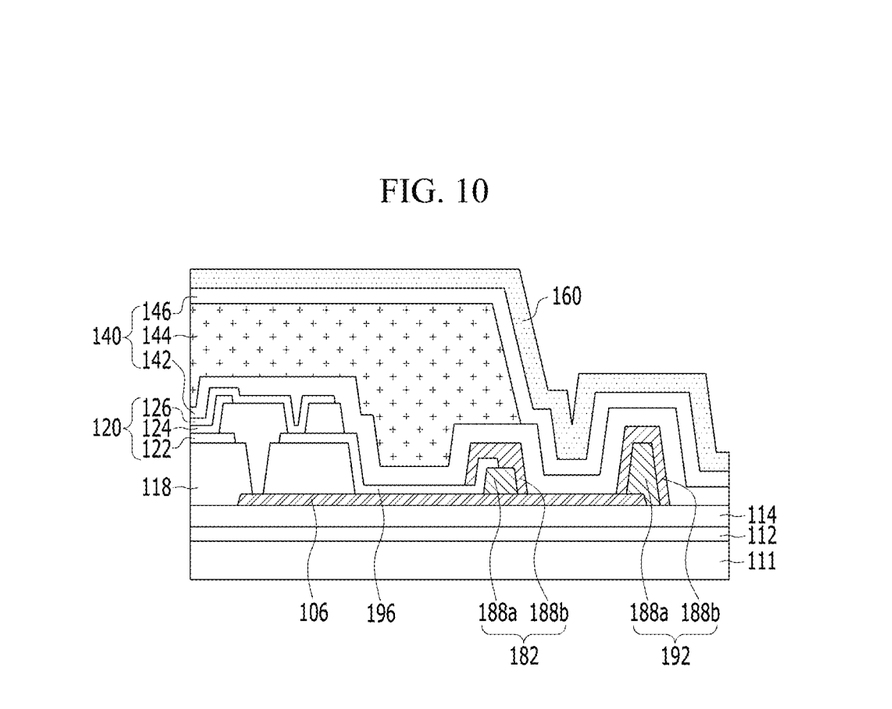
FIG. 10 is a cross-sectional view showing a touch display device according to the present invention including an auxiliary electrode.

As shown in FIG. 10, an auxiliary electrode 196 may be disposed on the first sub-dam 188a of each of the first low dam 182 and the first high dam 184. The auxiliary electrode 196 is not disposed between the dams 180 and 190, and is disposed between the first sub-dam 188a of each of the first low dam 182 and the first high dam 184 and the pixel planarization layer 118. Accordingly, it is possible to increase the height of each of the first low dam 182 and the first high dam 184 while maintaining a shallow depth of the valley between the dams 180 and 190, thereby preventing the organic encapsulation layer 144 from spreading over the second low dam 192 and the second high dam 194.

The cathode 126 is connected to a low-voltage (VSS) supply line 106 through the auxiliary electrode 196. The low-voltage (VSS) supply line 106 is formed on the substrate 111 using the same material as the source and drain electrodes 136 and 138. The auxiliary electrode 196 is disposed between the low-voltage (VSS) supply line 106 and the cathode 126 and electrically connects the low-voltage (VSS) supply line 106 to the cathode 126. The auxiliary electrode 196 is formed of the same material as the cathode 126.

Figure 11:
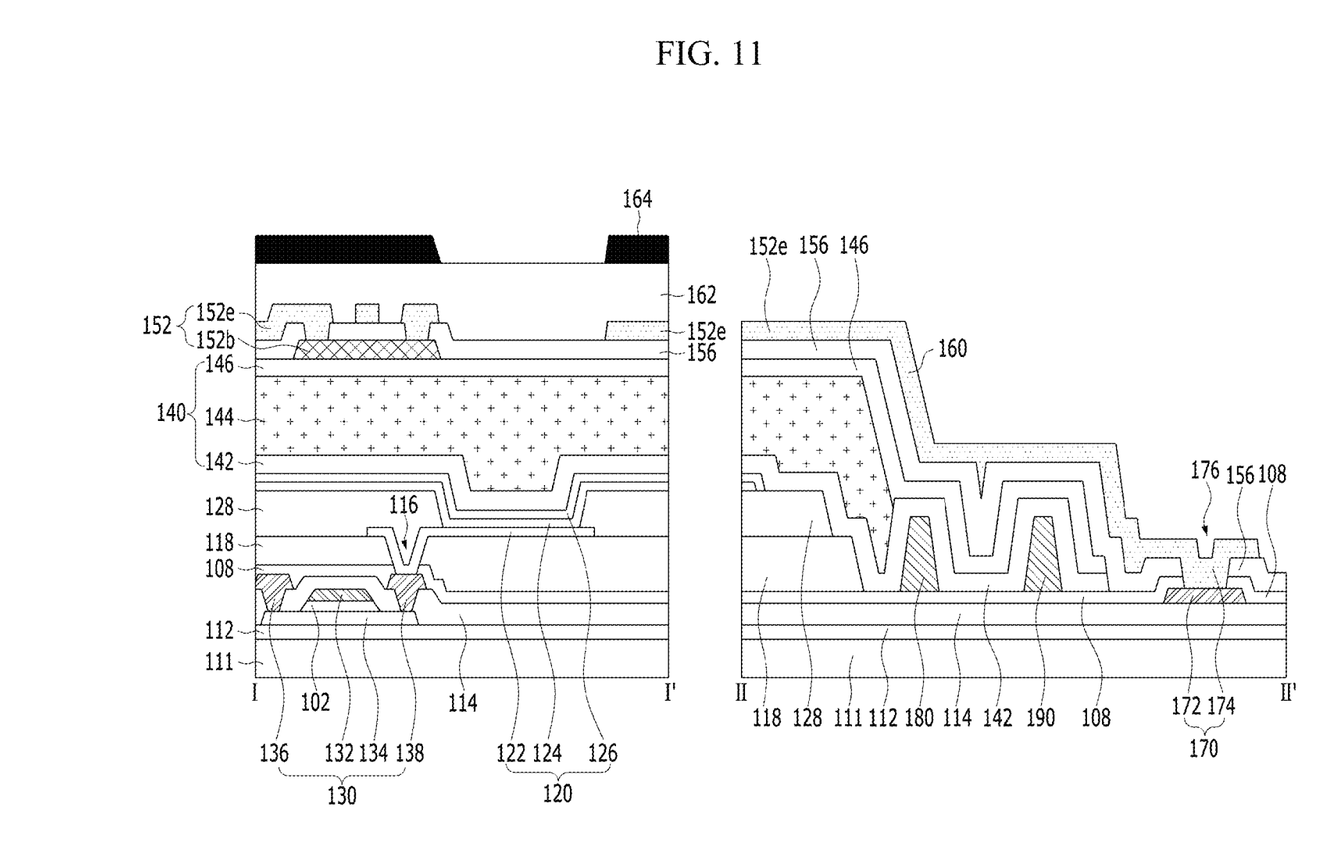
FIG. 11 is a cross-sectional view showing a touch display device according to another embodiment of the present invention.

FIG. 11 is a cross-sectional view showing a touch display device according to a second embodiment of the present invention.

The touch display device shown in FIG. 11 includes the same components as the touch display device shown in FIG. 3, except that a black matrix 164 is further included. Accordingly, a detailed description of the same components will be omitted.

The black matrix 164 is disposed so as to overlap the bank 128. The black matrix 164 serves to distinguish subpixel areas and to prevent optical interference and light leakage between adjacent sub-pixel areas. The black matrix 164 is formed of a high-resistance black insulating material, or is formed by stacking at least two of red (R), green (G), and blue (B) color layers.

In addition, since the black matrix 164 has light absorptivity, it is possible to reduce the reflection of external light by the touch electrodes 152e and 154e and the bridges 152b and 154b, thereby preventing the touch electrodes 152e and 154e and the bridges 152b and 154b from being visible under external light. In addition, the black matrix 164 may be disposed so as to also overlap the routing line 160, thereby reducing the reflection of external light by the routing line 160.

The touch planarization layer 162 is formed below the black matrix 164 using an organic insulating material, and flattens the substrate 111 having the touch electrodes 152e and 154e and the bridges 152b and 154b formed thereon.

A color filter may be disposed between the black matrices 164. That is, the color filter is disposed so as to overlap each of the subpixels SP. When the emission layer included in the light-emitting stack 124 emits white light, the color filter is disposed on the encapsulation unit 140. When the emission layer included in the light-emitting stack 124 emits red light, green light, and blue light corresponding to the respective subpixels, the color filter may be omitted from the display device.

In the present invention, a structure in which a color filter array including at least one of the touch planarization layer 162, the color filter, or the black matrix 164 is disposed on the touch electrodes 152e and 154e is described by way of example. Alternatively, the color filter array may be disposed below the touch electrodes 152e and 154e, particularly between the touch electrodes 152e and 154e and the encapsulation unit 140.

When the color filter array is disposed between the touch electrodes 152e and 154e and the encapsulation unit 140, the spacing distance between the touch electrodes 152e and 154e and the light-emitting element 120 is increased by the color filter array. Accordingly, the capacitance value of a parasitic capacitor formed between the touch electrodes 152e and 154e and the light-emitting element 120 may be minimized, and thus mutual influence between the touch electrodes 152e and 154e and the light-emitting element 120 due to coupling therebetween may be prevented.

The present invention is also applicable to a touch display device having a bending area.

As is apparent from the above description, a touch display device according to the present invention includes dams formed such that the shape of a dam in a region that overlaps routing lines and the shape of another dam in a region that does not overlap the routing lines are different from each other. Accordingly, it is possible to reduce the depth of the valley between the dams, thus preventing the occurrence of a short circuit between the routing lines.

In addition, since the dam formed in a region that does not overlap the routing lines has a higher height than the dam formed in a region that overlaps the routing lines, it is possible to prevent an organic encapsulation layer from spreading to a pad area over the dams.

It will be apparent to those skilled in the art that various modifications and variations can be made in the touch display device of the present disclosure without departing from the technical idea or scope of the disclosure. Thus, it is intended that the present disclosure covers the modifications and variations of this disclosure provided they come within the scope of the appended claims and their equivalents.

What is claimed is:

1. A touch display device, comprising:
   a light-emitting element disposed on a substrate;
   an encapsulation unit disposed on the light-emitting element;
   a plurality of touch electrodes disposed on the encapsulation unit;
   routing lines connected to the plurality of touch electrodes;
   a first dam disposed adjacent to an active area in which the light-emitting element is disposed; and
   a second dam spaced apart from the first dam and disposed farther from the active area than the first dam,
   wherein a first distance between the first dam and the second dam in a region that the first dam and the second dam overlap the routing lines is longer than a second distance between the first dam and the second dam in a region that the first dam and the second dam do not overlap the routing lines,
   wherein each of the first and second dams includes at least first and second sub-dams which are sequentially stacked, and
   wherein the second sub-dam is disposed on side and top surfaces of the first sub-dam so as to cover the side and top surfaces of the first sub-dam.

2. The touch display device according to claim 1, further comprising:
   a thin-film transistor connected to the light-emitting element;
   a pixel planarization layer disposed on the thin-film transistor;
   a bank disposed on the pixel planarization layer; and
   a spacer disposed on the bank.

3. The touch display device according to claim 2, wherein the first dam and the second dam are formed of same materials as at least two of the pixel planarization layer, the bank, and the spacer.

4. The touch display device according to claim 1, wherein at least one of the routing lines is disposed along a side surface of the encapsulation unit.

5. The touch display device according to claim 1, wherein the encapsulation unit comprises a plurality of inorganic encapsulation layers and at least one organic encapsulation layer.

6. The touch display device according to claim 5, further comprising:
a touch pad electrically connected to at least one of the routing lines.

7. The touch display device according to claim 6, wherein at least one of the plurality of inorganic encapsulation layers extends more toward the touch pad than the at least one organic encapsulation layer.

8. The touch display device according to claim 6, wherein the touch pad is disposed on one side of the substrate, and a distance between the first dam and the second dam is the same on the other side where the touch pad is not disposed.

9. The touch display device according to claim 1, further comprising:
an auxiliary electrode disposed between the active area and the first dam.

10. The touch display device according to claim 9, wherein the auxiliary electrode is disposed on the first sub-dam of the first dam.

11. The touch display device according to claim 1, further comprising:
a black matrix disposed on the plurality of touch electrodes.

12. The touch display device according to claim 11, wherein the black matrix is disposed so as to overlap the routing lines.

* * * * *